United States Patent
Lu

(10) Patent No.: US 10,068,851 B1
(45) Date of Patent: Sep. 4, 2018

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/608,733

(22) Filed: May 30, 2017

(51) Int. Cl.
```
H01L 23/52      (2006.01)
H01L 23/532     (2006.01)
H01L 23/482     (2006.01)
H01L 23/498     (2006.01)
H01L 23/31      (2006.01)
H01L 23/00      (2006.01)
H01L 23/495     (2006.01)
```

(52) U.S. Cl.
CPC ...... *H01L 23/5329* (2013.01); *H01L 23/3192* (2013.01); *H01L 23/4825* (2013.01); *H01L 23/498* (2013.01); *H01L 23/49503* (2013.01); *H01L 23/49816* (2013.01); *H01L 24/32* (2013.01); *H01L 2224/4501* (2013.01)

(58) Field of Classification Search
CPC ............. H01L 23/5329; H01L 23/3192; H01L 23/4825; H01L 23/49503; H01L 23/498; H01L 23/49816; H01L 24/32
See application file for complete search history.

(56) References Cited

U.S. PATENT DOCUMENTS

| | | | | |
|---|---|---|---|---|
| 5,401,913 A * | 3/1995 | Gerber | ................ | H01L 23/5385 174/262 |
| 5,726,497 A * | 3/1998 | Chao | .................. | H01L 21/76877 257/751 |
| 5,801,096 A * | 9/1998 | Lee | ................... | H01L 21/32136 257/E21.311 |
| 6,025,613 A * | 2/2000 | Bito | .................. | H01L 29/66462 257/192 |
| 6,198,169 B1 * | 3/2001 | Kobayashi | .............. | H01L 24/11 257/737 |
| 6,271,084 B1 * | 8/2001 | Tu | ........................... | H01L 28/60 257/E21.009 |
| 6,400,018 B2 * | 6/2002 | Clatanoff | .......... | H01L 23/49816 257/737 |
| 6,864,577 B2 * | 3/2005 | Clatanoff | .......... | H01L 23/49816 257/737 |

(Continued)

*Primary Examiner* — Sitaramarao S Yechuri
(74) *Attorney, Agent, or Firm* — Foley & Lardner LLP; Cliff Z. Liu

(57) ABSTRACT

A semiconductor package structure includes a first dielectric layer, a conductive element, a first circuit structure, a semiconductor die and an encapsulant. The first dielectric layer defines at least one through hole. The conductive element is disposed in the through hole and including a first portion and a second portion. A first surface of the first portion is substantially coplanar with a first surface of the first dielectric layer, and a portion of a first surface of the second portion is recessed from the first surface of the first dielectric layer. The first circuit structure is disposed on the first dielectric layer. The semiconductor die is electrically connected to the first circuit structure. The encapsulant covers the semiconductor die.

27 Claims, 17 Drawing Sheets

(56) References Cited

U.S. PATENT DOCUMENTS

| | | | | |
|---|---|---|---|---|
| 6,929,978 | B2 * | 8/2005 | Anderson | H01L 21/4853 |
| | | | | 257/E21.505 |
| 7,561,360 | B2 | 7/2009 | Kamimura et al. | |
| 8,377,506 | B2 * | 2/2013 | Lee | H01L 21/4846 |
| | | | | 204/192.1 |
| 2006/0097400 | A1 * | 5/2006 | Cruz | H01L 21/486 |
| | | | | 257/774 |
| 2007/0049031 | A1 * | 3/2007 | Kaifu | H01L 21/31116 |
| | | | | 438/689 |
| 2011/0068427 | A1 * | 3/2011 | Paek | H01L 24/19 |
| | | | | 257/433 |
| 2015/0311084 | A1 * | 10/2015 | Moore | H01L 21/28587 |
| | | | | 257/280 |

\* cited by examiner

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and more particularly to a semiconductor package structure including a conductive element having a surface coplanar with a surface of a dielectric layer, and a method for manufacturing the semiconductor package structure.

2. Description of the Related Art

In a semiconductor package structure, a conductive via is included for electrical connection between different layers. The formation of the conductive via may include forming a hole on a substrate, and then forming a conductive element in the hole by plating. However, due to the composition of the electrolyte used in plating, the conductive element tends to form a dimple shape or a protrusion shape. In other words, an upper surface of the conductive element is not planar. Hence, a circuit layer may not be properly disposed on or above the conductive via. The dimple shape or the protrusion shape of the conductive element adversely affects the utilization of the substrate having such conductive via.

SUMMARY

In some embodiments, according to an aspect, a semiconductor package structure includes a first dielectric layer, a conductive element, a first circuit structure, a semiconductor die and an encapsulant. The first dielectric layer defines at least one through hole. The conductive element is disposed in the through hole and including a first portion and a second portion. A first surface of the first portion is substantially coplanar with a first surface of the first dielectric layer, and a portion of a first surface of the second portion is recessed from the first surface of the first dielectric layer. The first circuit structure is disposed on the first dielectric layer. The semiconductor die is electrically connected to the first circuit structure. The encapsulant covers the semiconductor die.

In some embodiments, according to another aspect, a semiconductor package structure includes a first dielectric layer, a conductive element, a first circuit structure, a semiconductor die and an encapsulant. The first dielectric layer defines at least one through hole. The conductive element is disposed in the through hole and defining at least one recess portion. The first circuit structure is disposed on the first dielectric layer and the conductive element. The first circuit structure includes a first portion conformal with the recess portion of the conductive element. The semiconductor die electrically is connected to the first circuit structure. The encapsulant covers the semiconductor die.

In some embodiments, according to another aspect, a method for manufacturing a semiconductor package device includes (a) providing a first dielectric layer defining at least one through hole; (b) forming a patterned photoresist layer on the first dielectric layer, wherein a first portion of the patterned photoresist layer is located above the through hole; (c) forming a conductive element in the through hole, wherein the conductive element contacts the first portion of the patterned photoresist layer; and (d) forming a first circuit structure on the dielectric layer and on the conductive element.

In some embodiments, according to another aspect, a semiconductor package structure includes a first dielectric layer, a first circuit structure, a semiconductor die and an encapsulant. The first dielectric layer defines at least one through hole. The first circuit structure is disposed on the first dielectric layer and extends to the through hole. The circuit structure includes a trace and a conductive via, and the conductive via includes a protrusion portion protruding from a first surface of the first dielectric layer. The trace is disposed on the conductive via. The semiconductor die is electrically connected to the circuit structure. The encapsulant covers the semiconductor die.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
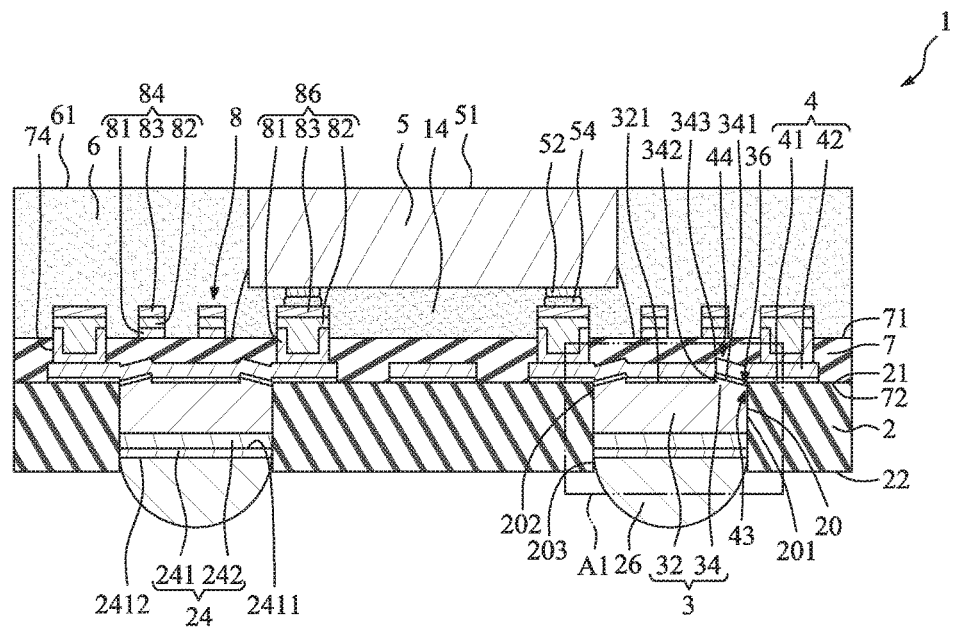
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a semiconductor package structure including a conductive element having a surface coplanar with a surface of a dielectric layer, and techniques for manufacturing the semiconductor package structure including a via structure with such a conductive element.

In a semiconductor package, a conductive via is included for electrical connection between different layers. A method for manufacturing a via structure may include forming a hole on a substrate, and then forming a conductive element in the hole by plating. However, due to the composition of the electrolyte used in plating, the conductive element tends to form a dimple shape or a protrusion shape. In other words, an upper surface of the conductive element is not planar.

Due to the dimple shape or protrusion shape of the conductive element, a circuit structure, such as a conductive trace, may not be disposed properly on or above the conductive element. For example, after forming the conductive element, a second dielectric layer is formed on the first dielectric layer and on the conductive element. Then, the circuit structure is formed on the second dielectric layer. The process for forming the circuit structure may include forming a patterned photoresist layer covering one or more portions of the second dielectric layer, and then forming the circuit structure on other portions of the second dielectric layer which are not covered by the patterned photoresist layer. In the case that the second dielectric layer is a thin film, the shape of the second dielectric layer may be conformal to the surface of the conductive element. Accordingly, a portion of an upper surface of the second dielectric layer right above the conductive element is not planar. Portions of the patterned photoresist layer right above the conductive element may collapse due to the dimple or protrusion shape of the conductive element, resulting in defect of the circuit structure formed thereafter. For example, the circuit structure defect may occur when a line width and a line space (L/S) of the circuit structure are less than, for example, about 7 µm and about 7 µm, about 5 µm and about 5 µm, or about 2 µm and about 2 µm, respectively.

Embodiments of the present disclosure provide a semiconductor package structure having a conductive element that addresses at least the above concerns. In some embodiments, at least a portion of an upper surface of the conductive element is in a flat form. Thus, a circuit structure, such as a conductive trace, may be disposed properly on or above the conductive element.

Figure 2:
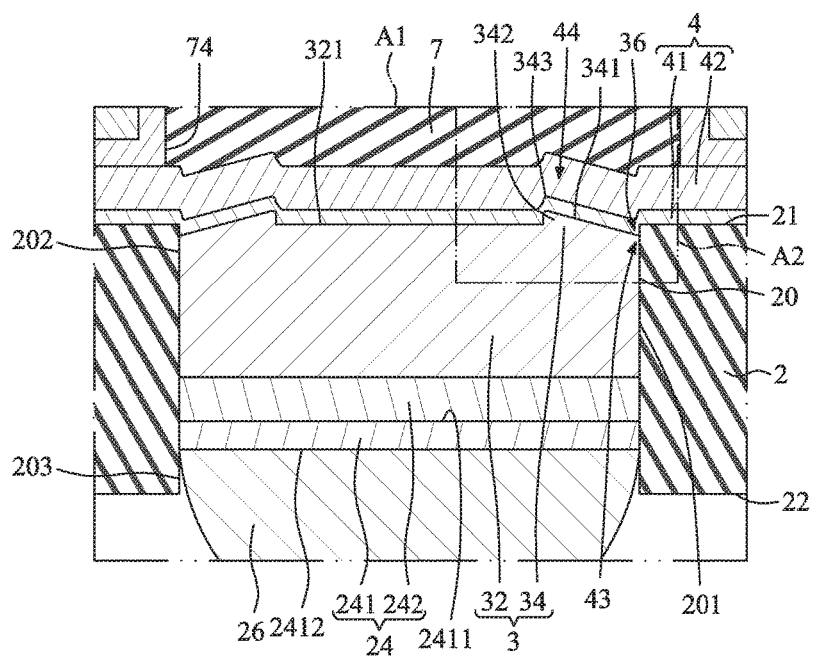
FIG. 2 illustrates an enlarged view of the area A1 in FIG. 1.

FIG. 1 illustrates an example of a semiconductor package structure 1 according to some embodiments of the present disclosure. FIG. 2 illustrates an enlarged view of the area A1 in FIG. 1. The semiconductor package structure 1 includes a first dielectric layer 2, a base layer 24, a solder ball 26, a conductive element 3, a first circuit structure 4, a second dielectric layer 7, a second circuit structure 8, a semiconductor die 5, and an encapsulant 6.

The first dielectric layer 2 may be, for example, a passivation layer or a solder mask layer. In some embodiments, the first dielectric layer 2 may include, or be formed from, a cured photoimageable dielectric (PID) material such as epoxy or polyimide (PI) including photoinitiators. The first dielectric layer 2 has a first surface 21 and a second surface 22 opposite to the first surface 21, and defines at least one through hole 20. The through hole 20 extends through the first dielectric layer 2. The through hole 20 includes a side wall 201, and has a first end 202 and a second end 203 opposite to the first end 202. The first end 202 is close to the first surface 21 of the first dielectric layer 2, and the second end 203 is close to the second surface 22 of the first dielectric layer 2.

The base layer 24 is disposed in the through hole 20 and adjacent to the second end 203 of the through hole 20. The base layer 24 may include a first metal layer 241 and a second metal layer 242. The first metal layer 241 may include, e.g., gold, and a thickness of the first metal layer 241 may be, e.g., less than about 0.01 µm, less than about 0.02 µm, less than about 0.05 µm, less than about 0.1 µm, or less than about 0.5 µm. The second metal layer 242 may include, e.g., nickel, and a thickness of the second metal layer may be, e.g., less than about 0.5 µm, less than about 1 µm, less than about 2 µm, less than about 3 µm, or less than about 5 µm. The first metal layer 241 and the second metal layer 242 may be formed by, e.g., plating. The first metal layer 241 is adjacent to the second end 203 of the through hole 20, and the second metal layer 242 is disposed on a first surface 2411 of the first metal layer 241 facing the first end 202 of the through hole 20. In some embodiments, the second metal layer 242 including nickel may be a barrier layer for preventing diffusion of the material of the conductive element 3 disposed thereon.

The solder ball 26 is disposed on a second surface 2412 of the first metal layer 241 facing the second end 203 of the through hole 20. In some embodiments, the solder ball 26 may be substantially in a hemisphere shape and may protrude from the second surface 22 of the first dielectric layer 2. In some embodiments, a height of the solder ball 26 may be reduced for using in, e.g., a land grid array (LGA).

The conductive element 3 is disposed in the through hole 20 of the first dielectric layer 2. For example, the conductive element 3 is disposed on the base layer 24 in the through hole 20. The material of the conductive element 3 may include, for example, conductive metal such as copper or another metal or metal alloy, or other electrically conductive material.

Figure 3:
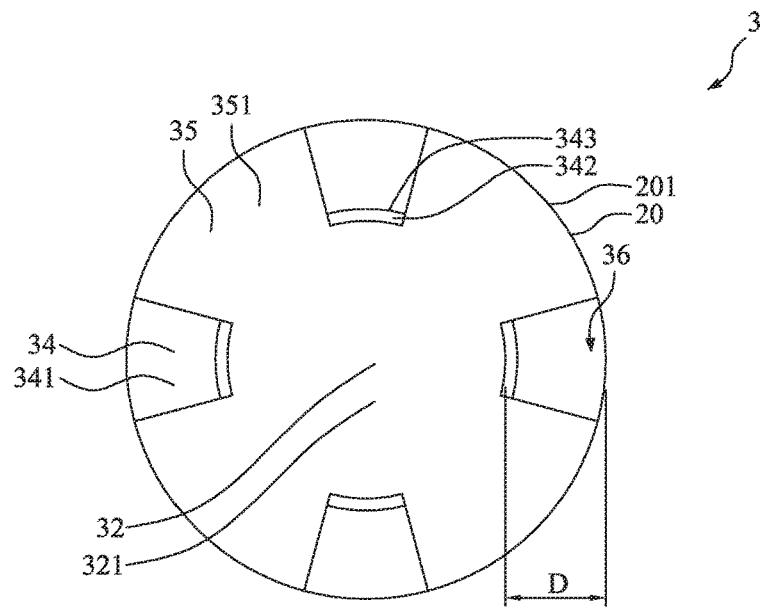
FIG. 3 illustrates a top view of the conductive element of the semiconductor package structure shown in FIG. 1.

FIG. 3 illustrates a top view of the conductive element 3 of the semiconductor package structure 1 shown in FIG. 1. The conductive element 3 includes a first portion 32 and at least one second portion 34. In some embodiments, the conductive element 3 may further include at least one third portion 35. In some embodiments, as shown in FIG. 3, the conductive element 3 includes a first portion 32, a plurality of second portions 34, a plurality of third portions 35 and defines at least one recess portion 36.

The first portion 32 includes a first surface 321 substantially coplanar with the first surface 21 of the first dielectric layer 2 (as shown in FIG. 2). As shown in FIG. 3, the first portion 32 of the conductive element 3 is located at or in proximity to a center of the through hole 20. For example, the first portion 32 is substantially located at the center of the conductive element 3.

Figure 4:
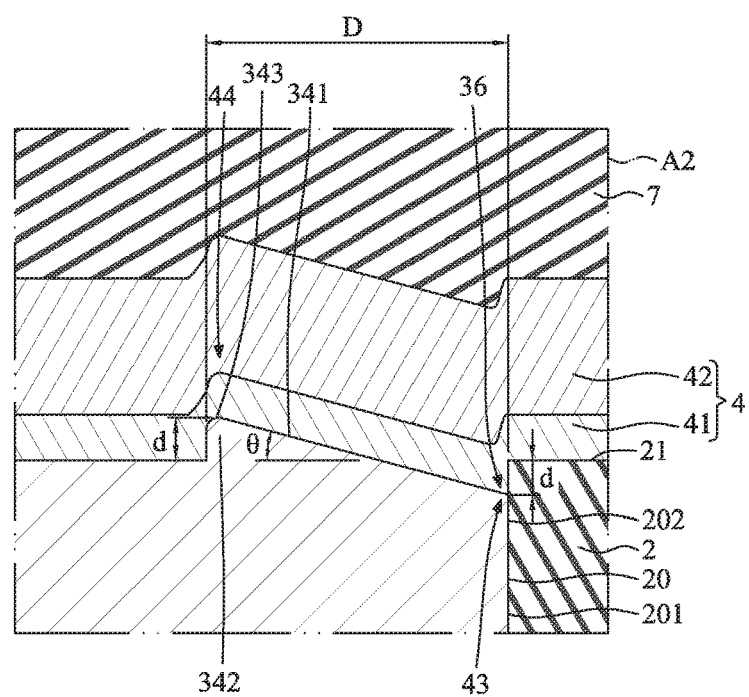
FIG. 4 illustrates an enlarged view of the area A2 in FIG. 2.

The second portions 34 and the third portion 35 may be away from the center of the through hole 20 and adjacent to the side wall 201 of the through hole 20. Thus, the second portions 34 and the third portions 35 are located at a periphery of the conductive element 3. In some embodiments, the second portions 34 and the third portions 35 are alternately arranged on the peripheral surface of the first portion 32. As shown in FIG. 3, the first portion 32 may be surrounded by the second portions 34 and the third portions 35. Each of the second portions 34 includes a first surface 341 and a protrusion portion 342. A portion of the first surface 341 is recessed from the first surface 21 of the first dielectric layer 2 to form a recess portion 36 (as shown in FIGS. 2, 3 and 4). The protrusion 342 has a peak 343. Each of the third portions 35 includes a first surface 351 substantially coplanar with the first surface 321 of the first portion 32 and the first surface 21 of the first dielectric layer 2.

FIG. 4 illustrates an enlarged view of the area A2 in FIG. 2. The protrusion portion 342 protrudes from the first surface 21 of the first dielectric layer 2. The recess portion 36 is defined by the first surface 341 of the second portion 34 and the side wall 201 of the through hole 20. An angle θ is formed between the first surface 341 of the second portion 34 of the conductive element 3 and the first surface 21 of the first dielectric layer 2. In some embodiments, the angle θ may be, e.g., about 0 degree to about 5 degrees, about 0 degree to about 10 degrees, about 0 degree to about 15 degrees, about 0 degree to about 30 degrees, about 0 degree to about 45 degrees, or about 0 degree to about 60 degrees.

The protrusion portion 342 of the second portion 34 may have a maximal thickness "d" measured from the first surface 321 of the first portion 32. For example, the maximal thickness "d" of the protrusion portion 342 may be defined between the surface 321 of the first portion 32 and the peak 343 of the protrusion 342. A distance "D" may be defined between an inner edge of the protrusion 342 adjacent to the center of the through hole 20 and the side wall 201 of the through hole 20 (as shown in FIGS. 3 and 4). In some embodiments, $$d \le \frac{D}{2} \times \tan\theta.$$

In some embodiments, the thickness "d" may be, e.g., less than about 0.5 µm, less than about 1 µm, less than about 2 µm, less than about 3 µm, less than about 5 µm, less than about 10 µm, or less than 20 µm. In some embodiments, a maximal thickness of the recess portion 36 measured from the first surface 321 of the first portion 32 may be substantially the same as the maximal thickness "d" of the protrusion portion 342.

Referring back to FIG. 1 and FIG. 2, the first circuit structure 4 is disposed on the first dielectric layer 2 and extends to the through hole 20 (and/or the space above the through hole 20). In some embodiments, a portion of the first circuit structure 4 may be disposed on the first portion 32, the second portions 34 or the third portions 35 of the conductive element 3. For example, the first circuit structure 4 may include a first portion 43 conformal with the recess portion 36 of the conductive element 3, and a second portion 44 conformal with the protrusion portion 341 of the conductive element 3. In some embodiments, the first circuit structure 4 and the conductive element 3 can jointly to be defined as a circuit structure. In some embodiments, the conductive element 3 and the portions of the first circuit structure 4 which is disposed thereon may be jointly defined as a conductive via of the circuit structure. The other portions of the first circuit structure 4 which are disposed on the dielectric layer 2 and not on the conductive element 3 may be defined as a trace of the circuit structure.

The first circuit structure 4 may include a plurality of metal layers. As shown in FIG. 1, FIG. 2 and FIG. 4, the first circuit structure 4 may include a third metal layer 41 and a fourth metal layer 42. The material of the third metal layer 41 may include, e.g., titanium and/or copper. A thickness of the third metal layer 41 may be, e.g., about 0.1 µm to about 0.5 µm, about 0.2 µm to about 0.5 µm, about 0.1 µm to about 1 µm, or about 0.1 µm to about 1 µm. The material of the fourth metal layer 42 may include, e.g., copper. The thickness of the fourth metal layer 42 may be, e.g., about 2 µm to about 5 µm, about 1 µm to about 10 µm, or about 1 µm to about 20 µm. In some embodiments, the third metal layer 41 may be a seed layer formed by sputtering, and the fourth metal layer 42 may be formed by pattern plating. Accordingly, the first circuit structure 4, including the third metal layer 41 and the fourth metal layer 42, may be in form(s) of one or more thin films.

The second dielectric layer 7 may be disposed on the first dielectric layer 2 and the conductive element 3. For example, the second dielectric layer 7 is disposed on the second portion 32 of the conductive element 3. The second dielectric layer 7 covers the first circuit structure 4. The second dielectric layer 7 may be, for example, a passivation layer or a solder mask layer. In some embodiments, the second dielectric layer 7 may include, or be formed from, a cured photoimageable dielectric (PID) material such as epoxy or polyimide (PI) including photoinitiators. The second dielectric layer 7 has a first surface 71 and a second surface 72 opposite to the first surface 71, and defines one or more openings 74 (as shown in FIGS. 1 and 2). The second surface 72 of the second dielectric layer 7 faces and is disposed on the first surface 21 of the first dielectric layer 2. The openings 74 expose portions of the first circuit structure 4 on the first dielectric layer 2.

The second circuit structure 8 is disposed on, or embedded in, the second dielectric layer 7, and on the first circuit structure 4 in the opening 74 of the second dielectric layer 7. The second circuit structure 8 may be electrically connected to the first circuit structure 4. The second circuit structure 8 includes a plurality of conductive traces 84 and a plurality of bump pads 86. The conductive traces 84 may be disposed on the first surface 71 of the second dielectric layer 7, and are electrically connected to the bump pads 86. In some embodiments, at least one of the conductive traces 84 is disposed right above the conductive element 3. That is, a portion of the second circuit structure 8 is located right above the conductive element 3. In some embodiments, each of the bump pads 86 may be disposed in respective one of the openings 74 defined by the second dielectric layer 7, and may protrude from the first surface 71 of the second dielectric layer 7.

The second circuit structure 8 may include a plurality of metal layers. As shown in FIG. 1, the second circuit structure 8 includes a fifth metal layer 81, a sixth metal layer 82 and a seventh metal layer 83. The fifth metal layer 81 may include, for example, copper; the sixth metal layer 82 may include, for example, nickel; and the seventh metal layer 83 may include, for example, gold. The fifth metal layer 81, the sixth metal layer 82 and the seventh metal layer 83 may be formed by sputtering and/or plating, thus can be in the form of thin films. In some embodiments, the material of the seventh metal layer 83 may include, for example, tin, and the second circuit structure may further include a silver layer on the layer including tin.

As shown in FIG. 1, portions of the fifth metal layer 81, the sixth metal layer 82 and the seventh metal layer 83 disposed in the opening 74 defined by the second dielectric layer 7 constitute the bump pad 86. Portions of the fifth metal layer 81, the sixth metal layer 82 and the seventh metal layer 83 disposed on the first surface 71 of the second dielectric layer 7 are patterned and constitute the conductive trace 84. In addition, a line width and a line space (L/S) of the second circuit structure 8 are less than, e.g., about 7 µm and about 7 µm, about 5 µm and about 5 µm, or about 2 µm and about 2 µm, respectively.

As shown in FIG. 1, in some embodiments, a semiconductor die 5 is electrically connected to the first circuit structure 4. In some embodiments, the semiconductor die 5 includes a plurality of metal pillars 52 and a plurality of solder connectors 54. The metal pillars 52 are connected to the bump pads 86 through the solder connectors 54, such that the semiconductor die 5 is electrically connected to the first circuit structure 4. An underfill 14 is disposed in the space between the semiconductor die 5 and the second dielectric layer 7, so as to cover and protect the bump pads 86, the metal pillars 52 and the solder connectors 54. The encapsulant 6, which may include, for example, a molding compound, covers at least one side surface of the semiconductor die 5, the underfill 14 and the first surface 71 of the second dielectric layer 7. A top surface 61 of the encapsulant 6 is substantially coplanar with a top surface 51 of the semiconductor die 5, such that the heat from the semiconductor die 5 can be dissipated through the top surface 51.

Since the first portion 32 of the conductive element 3 has the first surface 321 substantially coplanar with the first surface 21 of the first dielectric layer 2, the second dielectric layer 7 disposed thereon can be provided with a smooth upper surface. Hence, the traces 84 can be disposed properly right above the conductive element 3.

Figure 5:
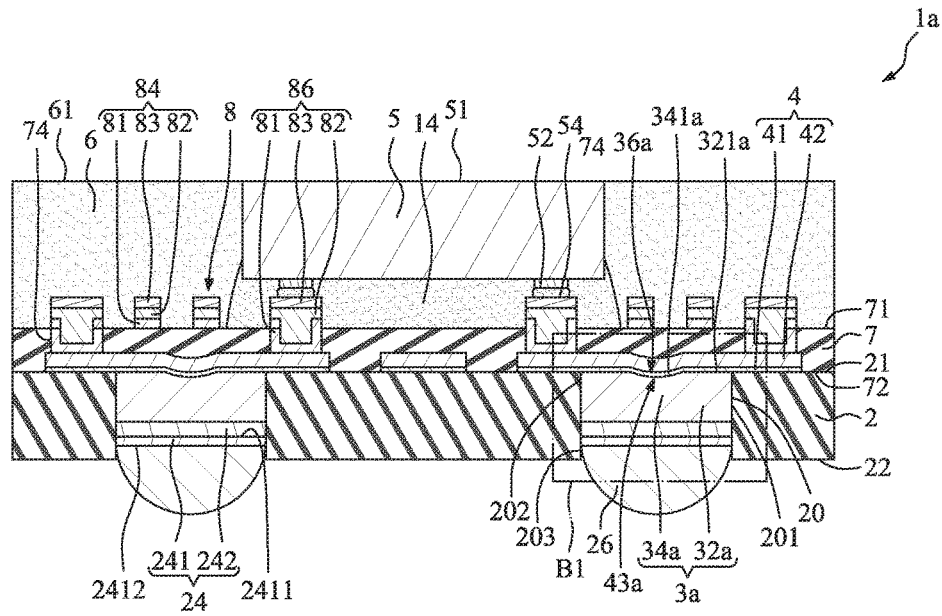
FIG. 5 illustrates a cross-sectional view of an example of a semiconductor package structure according to some embodiments of the present disclosure.
Figure 6:
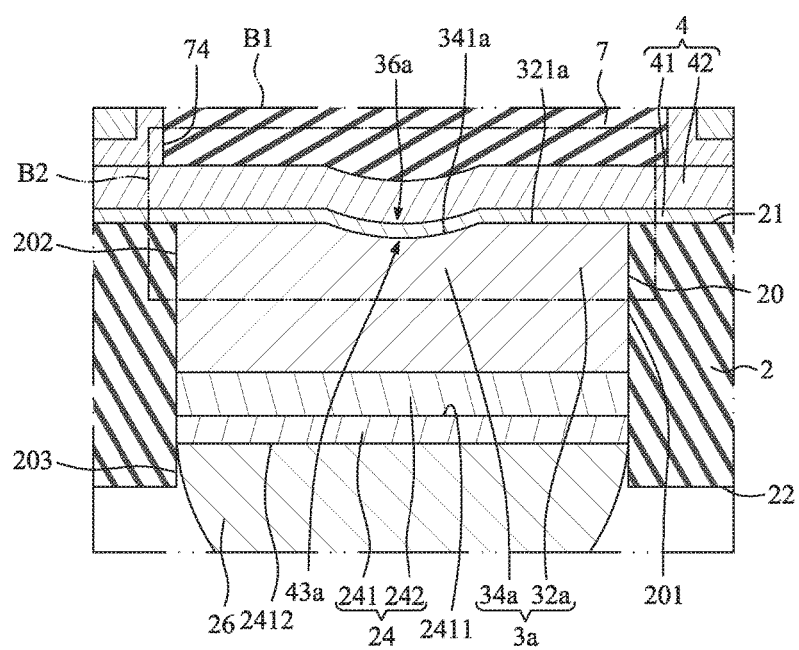
FIG. 6 illustrates an enlarged view of the area B1 in FIG. 5.
Figure 7:
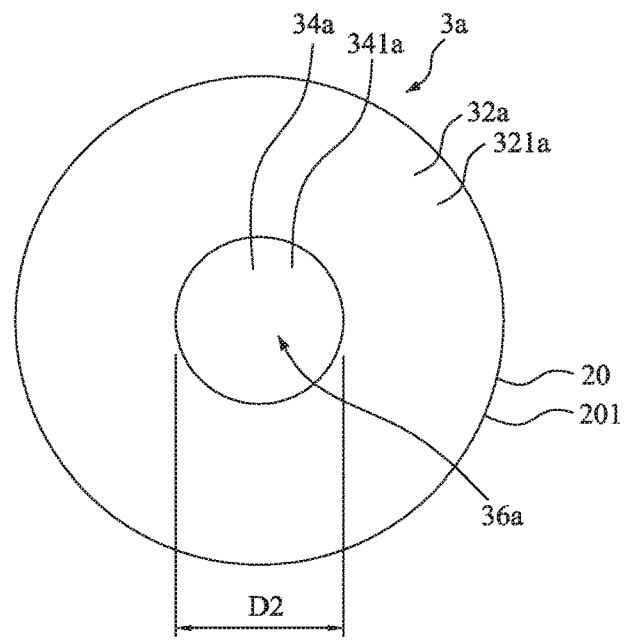
FIG. 7 illustrates a top view of the conductive element of the semiconductor package structure shown in FIG. 5.

In various embodiments, the conductive elements may have various structures and/or arrangements. FIG. 5 illustrates an example of a semiconductor package structure 1a according to some embodiments of the present disclosure. FIG. 6 illustrates an enlarged view of the area B1 in FIG. 5. FIG. 7 illustrates a top view of the conductive element 3a of the semiconductor package structure 1a shown in FIG. 5. The semiconductor package structure 1a is similar to the semiconductor 1 shown in FIG. 1, except the structures and arrangements related to the conductive element 3a.

As shown in FIG. 5, the conductive element 3a includes a first portion 32a and a second portion 34a. A first surface 321a of the first portion 32a is substantially coplanar with the first surface 21 of the first dielectric layer 2. A first surface 341a of the second portion 34a is recessed from the first surface 21 of the first dielectric layer 2. As shown in FIG. 7, the second portion 34a is located at, or in proximity to, the center of the through hole 20. For example, the second portion 34a is substantially located at the center of the conductive element 3. The first portion 32a is away from the center of the through hole 20 and adjacent to the side wall 201 of the through hole 20. For example, the first portion 32a is disposed around the second portion 34a. A recess portion 36a is defined by the first surface 341a of the second portion 34a. The first circuit structure 4 may also include a first portion 43a conformal with the recess portion 36a of the conductive element 3a. However, the second portion 44 of the first circuit structure 4 in FIG. 1 may be omitted in the semiconductor package structure 1a as shown in FIGS. 5, 6 and 7.

Figure 8:
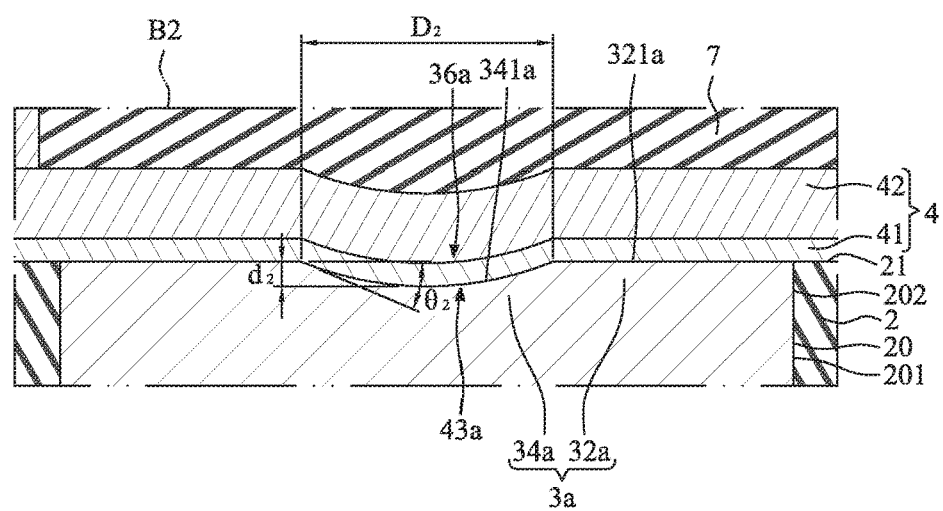
FIG. 8 illustrates an enlarged view of the area B2 in FIG. 6.

FIG. 8 illustrates an enlarged view of the area B2 in FIG. 6. An altitude difference "$d_2$" is defined between the first surface 321a of the first portion 32a and a lowest point of the first surface 341a of the second portion 34a. The second portion 34a has a maximal width "$D_2$." For example, as shown in FIG. 7, the second portion 34a is substantially in a circular shape, and the maximal width "$D_2$" is defined as a diameter of the second portion 34a. An angle $\theta_2$ is formed between the first surface 321a of the first portion 32a and the first surface 341a of the second portion 34a. In some embodiments, $$d_2 \leq \frac{D_2}{2} \times \tan\theta_2.$$

The angle $\theta_2$ may be, e.g., about 0 degree to about 5 degrees, about 0 degree to about 10 degrees, about 0 degree to about 15 degrees, about 0 degree to about 30 degrees, about 0 degree to about 45 degrees, or about 0 degree to about 60 degrees. The altitude difference "$d_2$" may be, e.g., less than about 1 μm, less than about 2 μm, less than about 5 μm, less than about 10 μm, or less than about 20 μm.

Similar to the semiconductor package structure 1 shown in FIG. 1 to FIG. 4, since the first portion 32a has the first surface 321a substantially coplanar with the first surface 21 of the first dielectric layer 2, the second dielectric layer 7 disposed thereon can be provided with a smooth upper surface. Hence, the traces 84 can be disposed properly right above the conductive element 3a.

Figure 9:
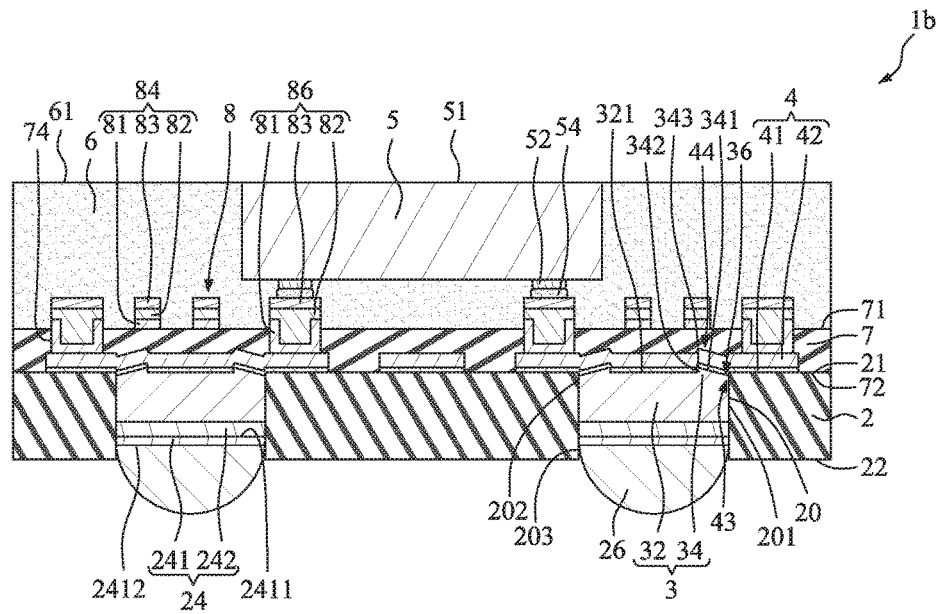
FIG. 9 illustrates an example of a semiconductor package structure according to some embodiments of the present disclosure.

In various embodiments, an encapsulant may be in various arrangements and may cover various portions of a semiconductor package structure. FIG. 9 illustrates an example of a semiconductor package structure 1b according to some embodiments of the present disclosure. The semiconductor package structure 1b is similar to the semiconductor 1 shown in FIG. 1, except that the underfill 14 depicted in FIG. 1 is omitted. Therefore, the encapsulant 6 further extends into a space between the semiconductor die 5 and the second dielectric layer 7, and covers and protects the bump pads 86, the solder connectors 54 and the metal pillars 52.

Figure 10:
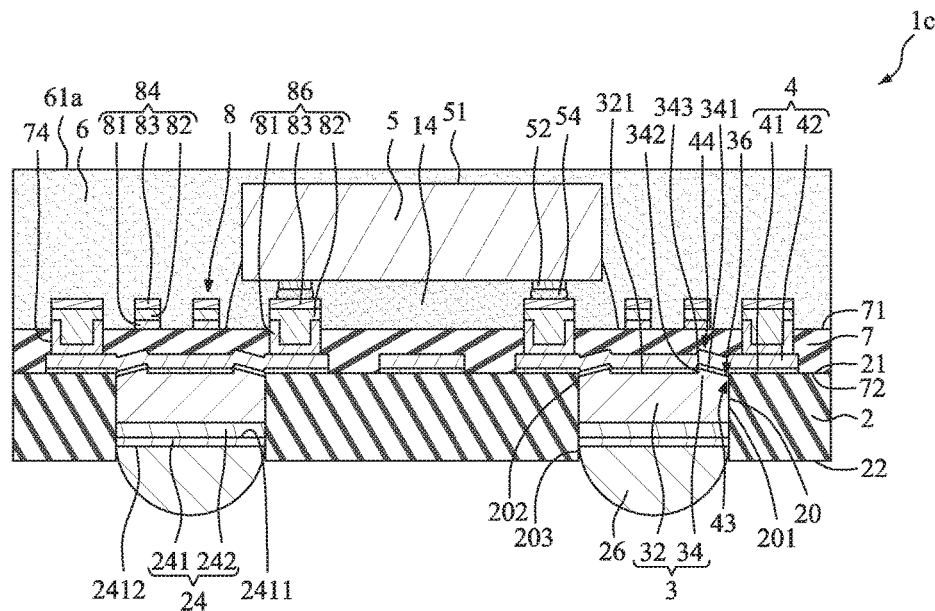
FIG. 10 illustrates an example of a semiconductor package structure according to some embodiments of the present disclosure.

FIG. 10 illustrates an example of a semiconductor package structure 1c according to some embodiments of the present disclosure. The semiconductor package structure 1c is similar to the semiconductor 1 shown in FIG. 1, except that the encapsulant 6 further covers the top surface 51 of the semiconductor die 5. For example, the top surface 61a is located above the top surface 51 of the semiconductor die 5.

Figure 11:
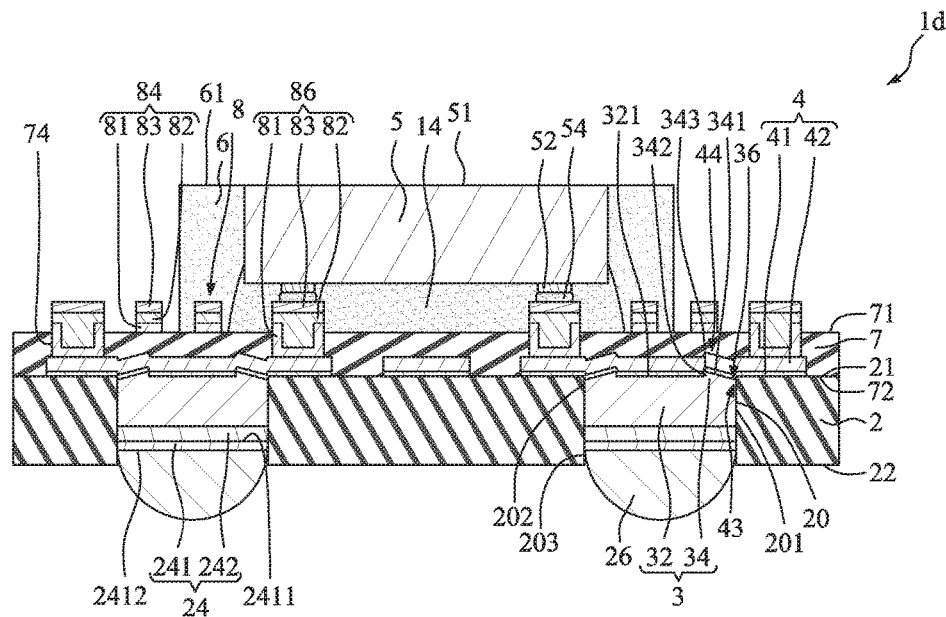
FIG. 11 illustrates an example of a semiconductor package structure according to some embodiments of the present disclosure.

FIG. 11 illustrates an example of a semiconductor package structure 1d according to some embodiments of the present disclosure. The semiconductor package structure 1d is similar to the semiconductor 1 shown in FIG. 1, except that the encapsulant 6 covers only a portion of the first surface 71 of the second dielectric layer 7 around the semiconductor die 5. For example, other portions of the first surface 71 of the second dielectric layer 7 are exposed and not covered by the encapsulant 6. Portions of the conductive traces 84 and the bump pads 86 are also exposed and not covered by the encapsulant 6.

Figure 12:
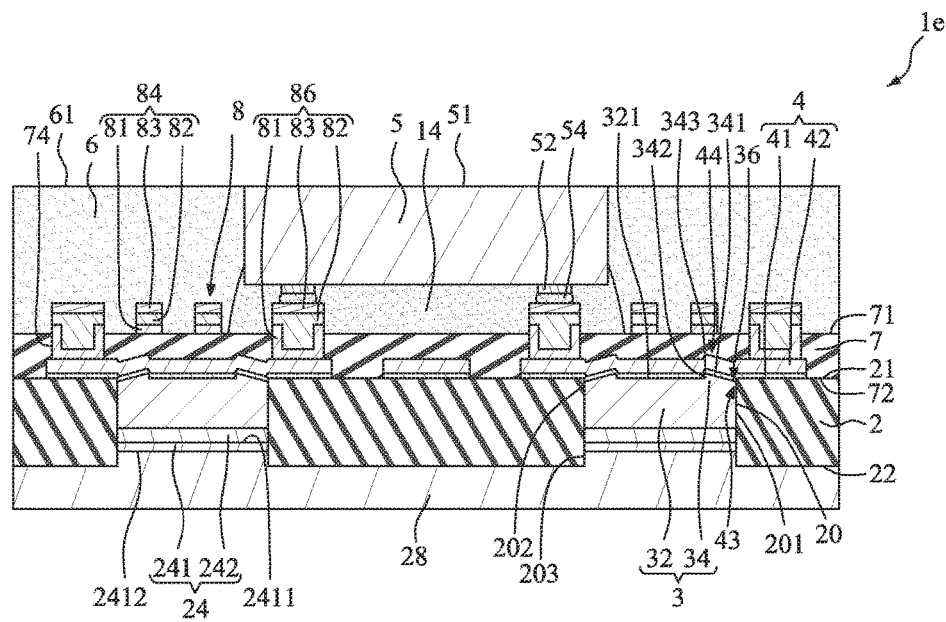
FIG. 12 illustrates an example of a semiconductor package structure according to some embodiments of the present disclosure.

FIG. 12 illustrates an example of a semiconductor package structure 1e according to some embodiments of the present disclosure. The semiconductor package structure 1e is similar to the semiconductor 1 shown in FIG. 1, except that the solder ball 26 in FIG. 1 may be omitted. Instead, an anisotropic conductive adhesive layer 28, such as anisotropic conductive film (ACF) or anisotropic conductive paste (ACP), may be disposed on the second surface 22 of the first dielectric layer 2 and may contact the base layer 24.

Figure 13:
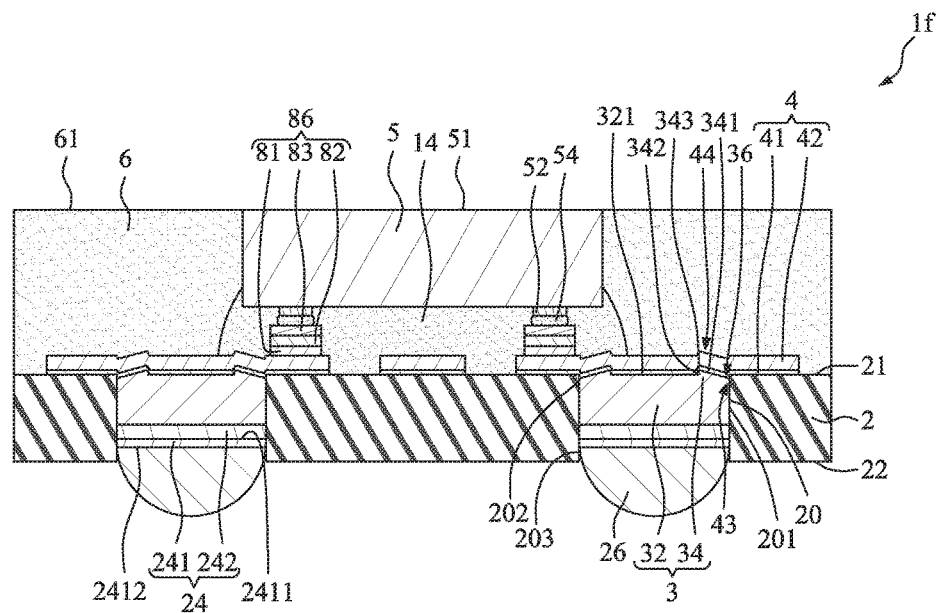
FIG. 13 illustrates an example of a semiconductor package structure according to some embodiments of the present disclosure.

In some embodiments, a semiconductor package structure may include one, two, three, four, or more dielectric layers. FIG. 13 illustrates an example of a semiconductor package structure 1f according to some embodiments of the present disclosure. The semiconductor package structure 1f is similar to the semiconductor 1 shown in FIG. 1, except that the second dielectric layer 7 in FIG. 1 may omitted. Accordingly, the conductive traces 84 on the second dielectric layer 7 may be also omitted. Hence, the encapsulant 6 and the underfill 14 may contact the first circuit structure 4 and the first surface 21 of the first dielectric layer 2.

Figure 14:
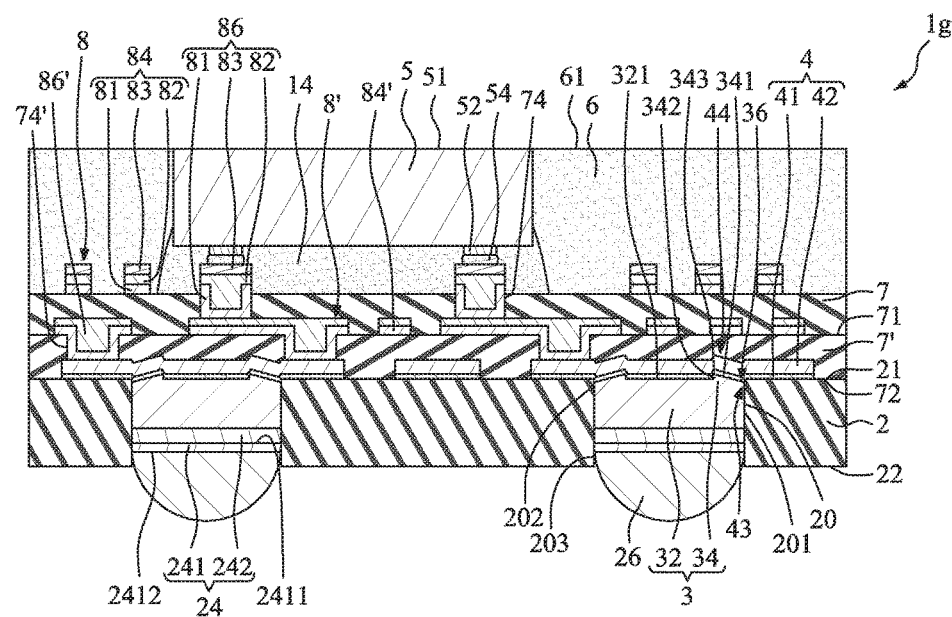
FIG. 14 illustrates an example of a semiconductor package structure according to some embodiments of the present disclosure.

FIG. 14 illustrates an example of a semiconductor package structure 1g according to some embodiments of the present disclosure. The semiconductor package structure 1g is similar to the semiconductor 1 shown in FIG. 1, except that the semiconductor package structure 1g further include a fourth dielectric layer 7' and a fourth circuit structure 8' disposed between the first dielectric layer 2 and the second dielectric layer 7. The fourth dielectric layer 7' is similar to the second dielectric layer 7, and also includes a plurality of openings 74' to exposed portions of the first circuit layer 4. The fourth circuit layer 8' is similar to the second circuit structure 8, and also includes a plurality of conductive trace 84' and a plurality of bump pad 86'. The conductive traces 84' are disposed on the fourth dielectric layer 7 and electrically connected to the bump pads 86'. Each of the bump pads 86' is disposed in respective one of the openings 74' and contact the first circuit structure 4. Accordingly, each of the bump pads 86 of the second circuit structure 8 is disposed in the openings 74 of the second conductive layer 7 and contacts the fourth circuit structure 8'. Hence, the second circuit structure 8 is electrically connected to the first circuit structure 4 through the fourth circuit structure 8'. In some embodiments, portions of the conductive traces 84 of the second circuit structure 8 and portions of the conductive traces 84' of the fourth circuit structure 84' may be disposed right above the conductive element 3.

Figure 15:
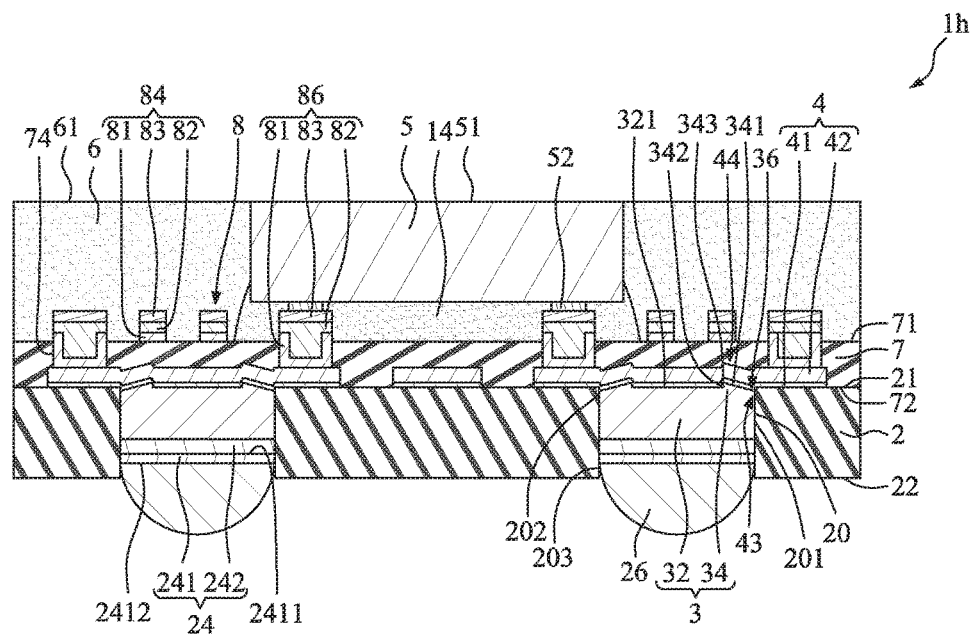
FIG. 15 illustrates an example of a semiconductor package structure according to some embodiments of the present disclosure.

FIG. 15 illustrates an example of a semiconductor package structure 1h according to some embodiments of the present disclosure. The semiconductor package structure 1g is similar to the semiconductor 1 shown in FIG. 1, except that the solder connectors 54 depicted in FIG. 1 may be omitted. Instead, the metal pillars 52 of the semiconductor die 5 may be directly connected to the conductive pads 86.

Figure 16:
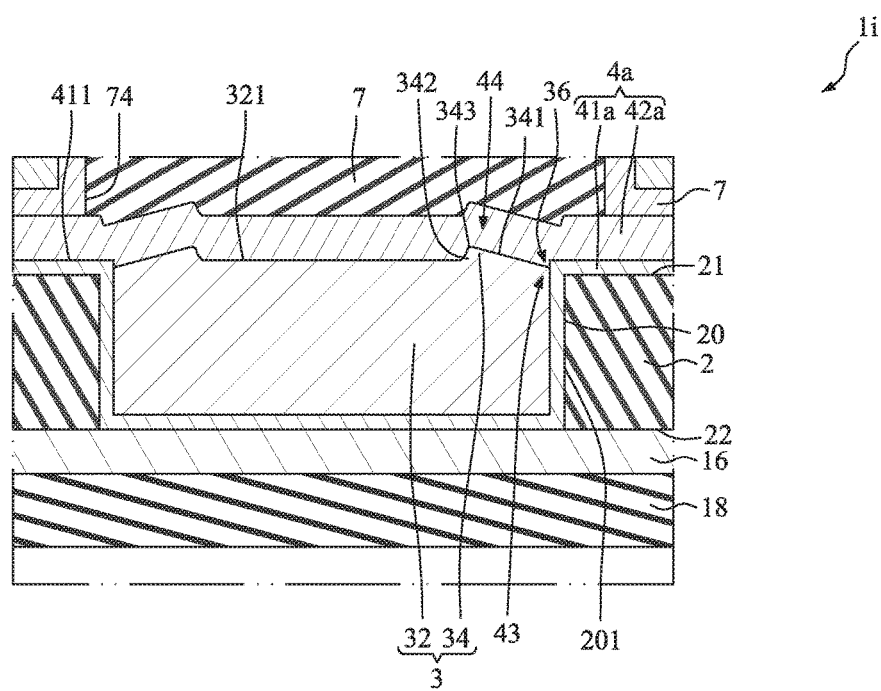
FIG. 16 illustrates an example of an enlarged view of a portion of a semiconductor package structure according to some embodiments of the present disclosure.

FIG. 16 illustrates an example of an enlarged view of a portion of a semiconductor package structure 1i according to some embodiments of the present disclosure. The semiconductor package structure 1i is similar to the semiconductor package structure 1 shown in FIG. 1 to FIG. 4, except that a portion of the third metal layer 41a of the first circuit structure 4a may be located under the conductive element 3.

The semiconductor package structure 1i further includes a third circuit structure 16 and a third dielectric layer 18, while the base layer 24 is omitted in the semiconductor package structure 1i. The third circuit structure 16 is disposed on the second surface 22 of the first dielectric layer 2, and a portion of the third circuit structure 16 is exposed in the through hole 20. The third dielectric layer 18 is disposed on the second surface 22 of the first dielectric layer 2 and covers the third circuit structure 16. The third metal layer 41a of the first circuit structure 4a is disposed on the first surface 21 of the first dielectric layer 2 and extends into the through hole 20 to contact the portion of the third circuit structure 16 exposed in through hole 20. The conductive element 3 is disposed in the through hole 20 and on the third metal layer 41a of the first circuit structure 4a. For example, a portion of the third metal layer 41a of the first circuit structure 4a is sandwiched between the third circuit structure 16 and the conductive element 3, and a portion of the third metal layer 41a of the first circuit structure 4a is sandwiched between the first dielectric layer 2 and the conductive element 3. In the semiconductor package structure 1i, the first surface 321 of the first portion 32 and the first surfaces 351 (as shown in FIG. 3) of the third portions 35 of the conductive element 3 are substantially coplanar with a first surface 411 of the third metal layer 41a on the first dielectric layer 2. The fourth metal layer 42a is disposed on the third metal layer 41a on the first surface 21 of the dielectric layer 2, and at least on the first portion 32 of the conductive element 3.

Figure 17:
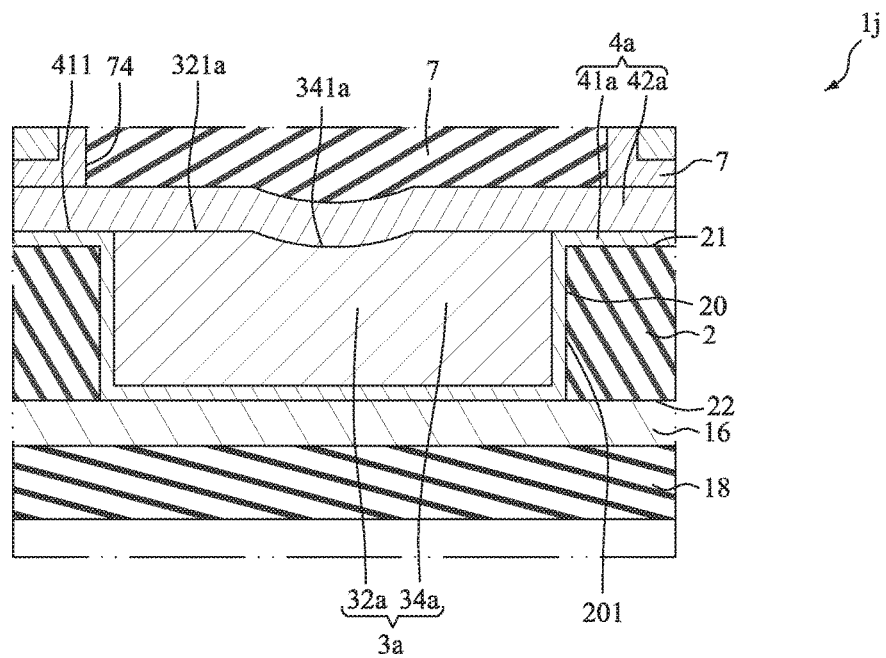
FIG. 17 illustrates an example of an enlarged view of a portion of a semiconductor package structure according to some embodiments of the present disclosure.

FIG. 17 illustrates an example of an enlarged view of a portion of a semiconductor package structure 1j according to some embodiments of the present disclosure. The semiconductor package structure 1j is similar to the semiconductor package structure 1i shown in FIG. 16, except that the structure of the conductive element 3a is the same as that of the conductive element 3a of the semiconductor 1a shown in FIG. 5 to FIG. 8. In the semiconductor package structure 1j, the first surface 321a of the first portion 32a of the conductive element 3a is substantially coplanar with a first surface 411 of the third metal layer 41a on the first dielectric layer 2.

FIG. 18 to FIG. 34 illustrate stages of an example of a method for manufacturing the semiconductor package structure according to some embodiments of the present disclosure.

Figure 18:
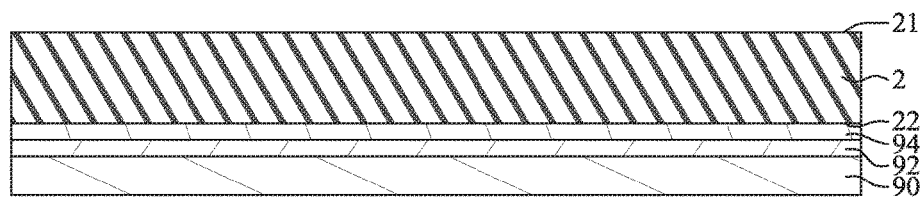
FIG. 18 illustrates one or more stages of an example of a method for manufacturing a semiconductor package structure according to some embodiments of the present disclosure.

Referring to FIG. 18, a carrier 90 is provided. In some embodiments, the material of the carrier 90 may be organic (e.g., may include polypropylene (PP), bismaleimide triazine (BT) resin, or a combination of two or more thereof) or inorganic (e.g., may include glass, silicon, ceramic, metal, or a combination of two or more thereof). The carrier 90 may be, e.g., rectangular, square, circular, elliptical or other shape from a top view. A metal layer 94, such as a copper foil, is attached to the carrier 90 via an adhesion layer 92. A first dielectric layer 2 is formed on the metal layer 94 of the carrier 90. The first dielectric layer 2 may be, for example, a passivation layer or a solder mask layer. In some embodiments, the first dielectric layer 2 may include, or be formed from, a cured photoimageable dielectric (PID) material such as epoxy or polyimide (PI) including photoinitiators. The first dielectric layer 2 has a first surface 21 and a second surface 22 opposite to the first surface 21. The second surface 22 of the first dielectric layer 2 is adhered to the metal layer 94.

Figure 19:
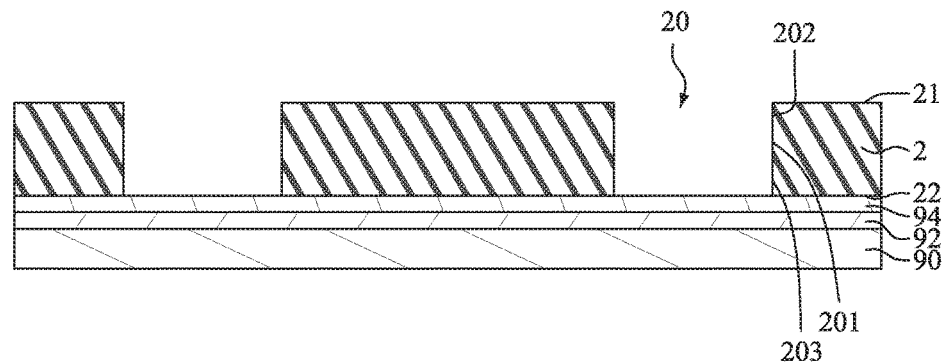
FIG. 19 illustrates one or more stages of an example of a method for manufacturing a semiconductor package structure according to some embodiments of the present disclosure.

Referring to FIG. 19, at least one through hole 20 is formed on the first dielectric layer 2. The through hole 20 may be formed by, for example, a lithography technique. The through hole 20 extends through the first dielectric layer 2, such that a portion of the metal layer 94 is exposed in the through hole 20. The through hole 20 includes a side wall 201, and has a first end 202 and a second end 203 opposite to the first end 202. The first end 202 is close to the first surface 21 of the first dielectric layer 2, and the second end 203 is close to the second surface 22 of the first dielectric layer 2

Figure 20:
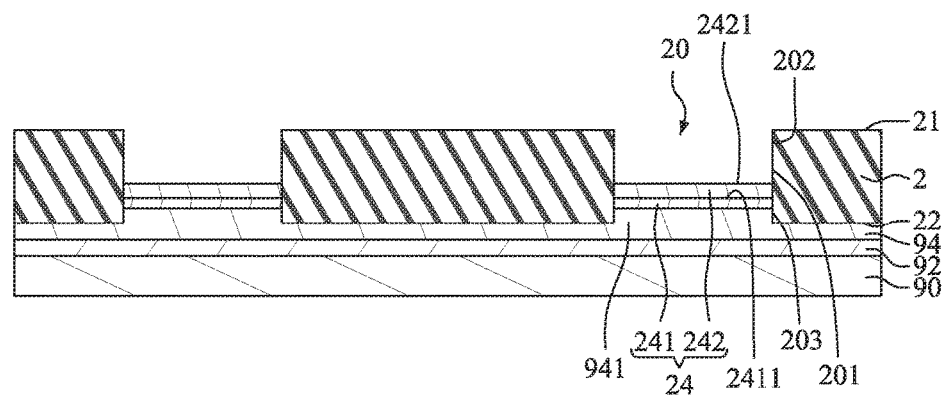
FIG. 20 illustrates one or more stages of an example of a method for manufacturing a semiconductor package structure according to some embodiments of the present disclosure.
Figure 23:
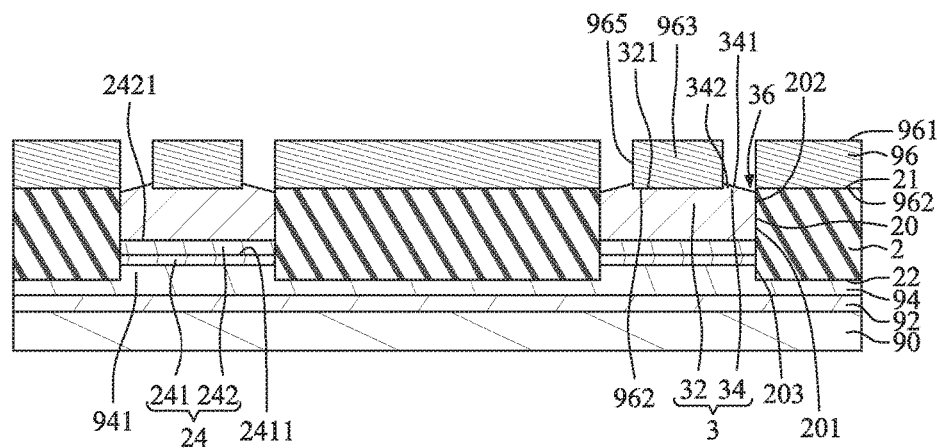
FIG. 23 illustrates one or more stages of an example of a method for manufacturing a semiconductor package structure according to some embodiments of the present disclosure.

Referring to FIG. 20, a thin layer 941 is formed in the through hole 20 of the first dielectric layer 2 and on the exposed metal layer 94. The material of the thin layer 941 may be the same as the material of the metal layer 94. Then, a base layer 24, including the first metal layer 241 and the second metal layer 242, is formed on the thin layer 941. The first metal layer 241 may include, e.g., gold, and a thickness of the first metal layer 241 may be, e.g., less than about 0.01 μm, less than about 0.02 μm, less than about 0.05 μm, less than about 0.1 μm, or less than about 0.5 μm. The second metal layer 242 may include, e.g., nickel, and a thickness of the second metal layer may be, e.g., less than about 0.5 μm, less than about 1 μm, less than about 2 μm, less than about 3 μm, or less than about 5 μm. The first metal layer 241 and the second metal layer 242 may be formed by, e.g., plating. The first metal layer 241 is formed on the thin layer 941 and adjacent to the second end 203 of the through hole 20, and the second metal layer 242 is disposed on a first surface 2411 of the first metal layer 241 facing the first end 202 of the through hole 20. In some embodiments, the second layer 242 including nickel may be a barrier layer for preventing diffusion of the material of the conductive element 3 (as shown in FIG. 23) disposed thereon. For example, the thin layer 941, the first metal layer 241 and the second layer 242 can be formed sequentially by, e.g., plating. In addition, the second metal layer 242 has a first surface 2421 in the through hole 20, and a uniformity of the first surface 2421 may be, e.g., less than about 1%, less than about 2%, less than about 5%, or less than about 10%.

In some embodiments, the uniformity may be determined or measured based on points of a surface. For example, multiple points (e.g., 5 points) of the surface may be selected randomly. A thickness of a layer or a film (e.g., thickness of the second metal layer 242) at each point is measured. Uniformity of the surface may be defined as, e.g., a difference between the maximal thickness and the minimal thickness, divided by twice an average of the thickness values at the selected points:

$$\text{uniformity} = \frac{x_{max} - x_{min}}{2 \times \bar{x}_i} \times 100\%.$$

Figure 21:
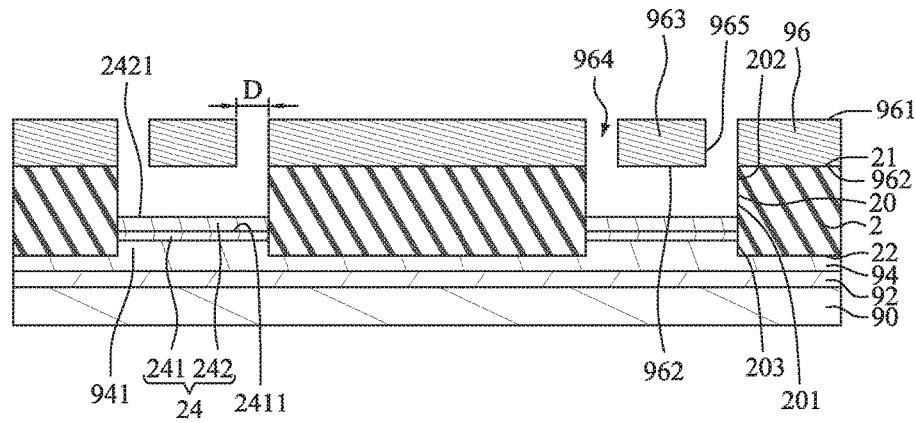
FIG. 21 illustrates one or more stages of an example of a method for manufacturing a semiconductor package structure according to some embodiments of the present disclosure.
Figure 22:
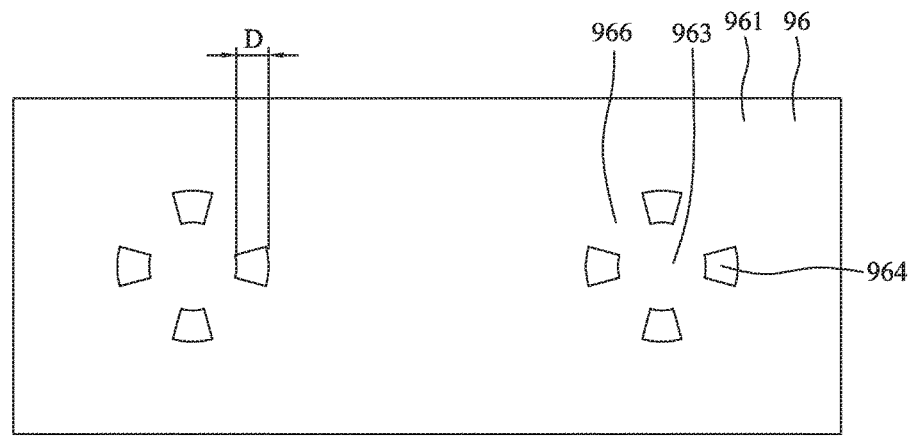
FIG. 22 illustrates one or more stages of an example of a method for manufacturing a semiconductor package structure according to some embodiments of the present disclosure.

Referring to FIG. 21, a patterned photoresist layer 96 is formed on the first dielectric layer 2. For example, the patterned photoresist layer 96 is formed the first surface 21 of the firs dielectric layer 2 and covers at least a portion of each of the through holes 20 of the first dielectric layer 2. The patterned photoresist layer 96 includes an upper surface 961 and a lower surface 962 opposite to the first surface 961. The lower surface 962 of the patterned photoresist layer 96 contacts the first surface 21 of the first dielectric layer 2. The patterned photoresist layer 96 includes at least one first portion 963 and defines at least one opening 964 communicating with the through hole 20 of the first dielectric layer 2. The first portion 963 of the photoresist layer 96 is located above the through hole 20, and includes a side surface 965. In some embodiments, the opening 964 is located at, or in proximity to, a center of the through hole 20, and the first portion 963 is located at a periphery of the through hole 20 and around the opening 964. However, in some embodiments, as shown in FIG. 22 illustrating a top view of the photoresist layer 96, the first portion 963 of the patterned photoresist layer 96 is located at a center of the through hole 20. The opening 964 is located at a periphery of the through hole 20. For example, in FIG. 22, the patterned photoresist layer 96 may define four openings 964 corresponding to each through hole 20 of the first dielectric layer 2, and the first portions 963 is surrounded by these four openings 964. A width "D" of the opening 964 is defined along a direction from a side wall 201 of the through hole 20 to a center of the through hole 20. The patterned photoresist layer 96 may further include a plurality of second portions 966. As shown in FIG. 22, the patterned photoresist layer 98 includes four second portions 966 arranged alternatively with the openings 964.

Referring to FIG. 23, a conductive element 3 is formed on the first surface 2421 of the second metal layer 242 in the through hole 20 by, for example, plating. Meanwhile, the conductive element 3 contacts the first portion 963 of the patterned photoresist layer 96. The conductive element 3 may be the same as the conductive element 3 shown in FIG. 1 to FIG. 4. The conductive element 3 includes a first portion 32 corresponding to and contacting the first portion 963 of the patterned photoresist layer 96, and a second portion 34 corresponding to the opening 964 defined by the patterned photoresist layer 96. The conductive element 3 also includes a third portion 35 (FIG. 3) corresponding to the second portion 966 (FIG. 22) of the patterned photoresist layer 96. A first surface 321 of the first portion 32 of the conductive element 3 contacts the lower surface 962 of the first portion 963 of the patterned photoresist layer 96, and is substantially coplanar with the first surface 21 of the first dielectric layer 2. The second portion 34 of the conductive element 3 extends to the side surface 965 of the first portion 963 of the photoresist layer 96 to form a protrusion portion 342. The protrusion portion 342 protrudes from the first surface 21 of the first dielectric layer 2.

The second portions 34 further define a recess portion 36. The recess portion 36 is defined by the first surface 341 of the second portion 34 and the side wall 201 of the through hole 20. An angle θ (FIG. 4) is formed between the first surface 341 of the second portion 34 of the conductive element 3 and the first surface 21 of the first dielectric layer 2. The angle θ may be, e.g., about 0 degree to about 5 degrees, about 0 degree to about 10 degrees, about 0 degree to about 15 degrees, about 0 degree to about 30 degrees, about 0 degree to about 45 degrees, or about 0 degree to about 60 degrees. The protrusion portion 342 of the second portion 34 has a maximal thickness "d" (FIG. 4) measured from the first surface 321 of the first portion 32. For example, the maximal thickness "d" of the protrusion portion 342 is defined between the surface 321 of the first portion 32 and a peak 343 (as shown in FIG. 4) of the protrusion 342. In some embodiments, $$d \leq \frac{D}{2} \times \tan\theta.$$

The thickness "d" may be, e.g., less than about 0.5 μm, less than about 1 μm, less than about 2 μm, less than about 3 μm, less than about 5 μm, less than about 10 μm, or less than 20 μm. In some embodiments, a maximal thickness of the recess portion 36 measured from the first surface 321 of the first portion 32 may be substantially the same as the maximal thickness "d" of the protrusion portion 342.

Figure 24:
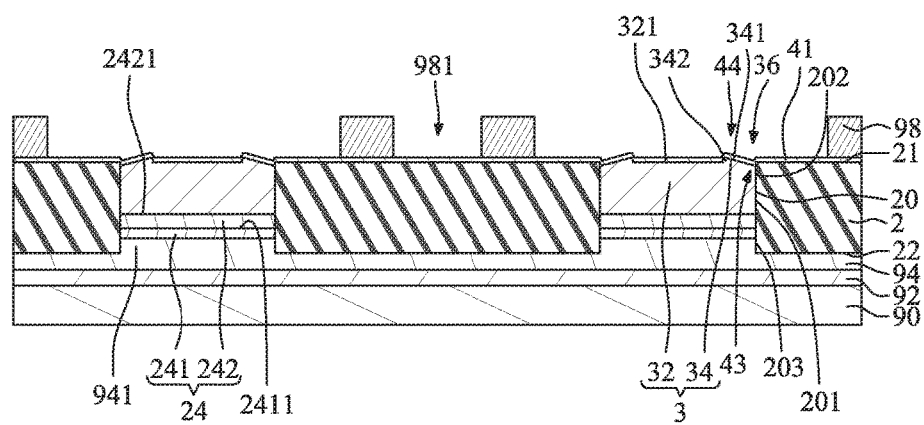
FIG. 24 illustrates one or more stages of an example of a method for manufacturing a semiconductor package structure according to some embodiments of the present disclosure.

Referring to FIG. 24, after forming the conductive element 3, the patterned photoresist layer 96 is removed by, for example, stripping. Then, a third metal layer 41 is formed on the first surface 21 of the first dielectric layer 2 and on the conductive element 3. The third metal layer 41 may be a seed layer formed by sputtering. The material of the third metal layer 41 may include titanium and/or copper, and a thickness of the third metal layer 41 may be, e.g., about 0.1 μm to about 0.5 about 0.2 μm to about 0.5 about 0.1 μm to about 1 μm, or about 0.1 μm to about 1 μm. Then, a second photoresist layer 98 is formed on the third metal layer 41. The second photoresist layer 98 defines a plurality of openings 981 to expose portions of the third metal layer 41.

Figure 25:
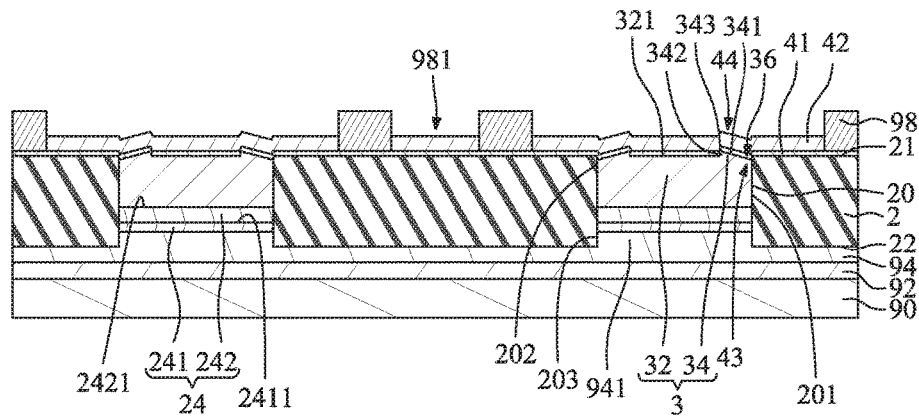
FIG. 25 illustrates one or more stages of an example of a method for manufacturing a semiconductor package structure according to some embodiments of the present disclosure.

Referring to FIG. 25, a fourth metal layer 42 is formed in the opening 981 of the second photoresist layer 98 and on the third metal layer 42. The fourth metal layer 42 may be formed by, for example, pattern plating. The material of the fourth metal layer 42 may include copper, and the thickness of the fourth metal layer 42 may be, e.g., about 0.1 μm to about 10 μm, about 1 μm to about 10 μm, or about 2 μm to about 5 μm.

Figure 26:
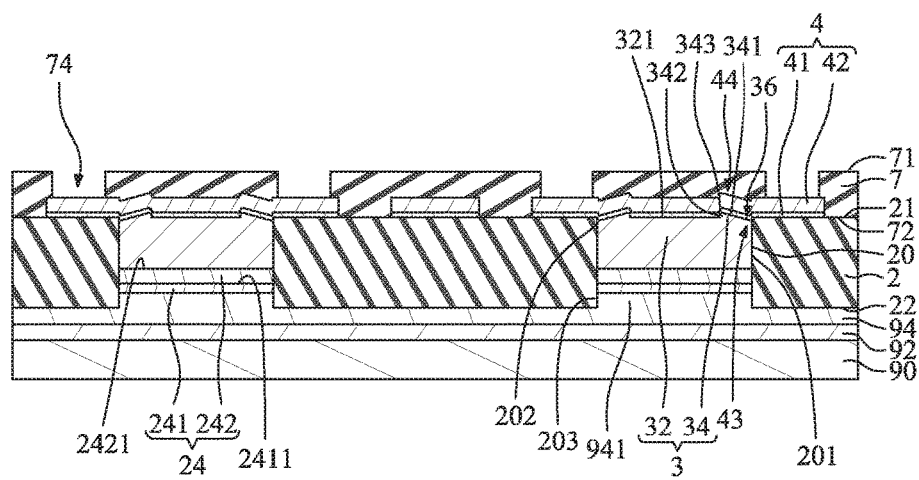
FIG. 26 illustrates one or more stages of an example of a method for manufacturing a semiconductor package structure according to some embodiments of the present disclosure.

Referring to FIG. 26, the second photoresist layer 98 is removed by, for example, stripping. Then, portions of the third metal layer 41 not covered by the fourth metal layer 42 are removed by, for example, etching. Accordingly, a first circuit structure 4, including the third metal layer 41 and the fourth metal layer 42, is formed. A portion of the first circuit structure 4 is disposed on the first portion 32, the second portions 34 or the third portions 35 of the conductive element 3. For example, the first circuit structure 4 includes a first portion 43 conformal with the recess portion 36 of the conductive element 3, and a second portion 44 conformal with the protrusion portion 341 of the conductive element 3.

Then, a second dielectric layer 7 is formed on the first dielectric layer 2 and covers the first circuit structure 4. The second dielectric layer 7 may be, for example, a passivation layer or a solder mask layer. In some embodiments, the second dielectric layer 7 may include, or be formed from, a cured photoimageable dielectric (PID) material such as epoxy or polyimide (PI) including photoinitiators. The second dielectric layer 7 has a first surface 71 and a second surface 72 opposite to the first surface 71. The second surface 72 of the second dielectric layer 7 faces and is disposed on the first surface 21 of the first dielectric layer 2. A plurality of openings 74 is formed on the second dielectric layer 7 to expose portions of the first circuit structure 4.

Figure 27:
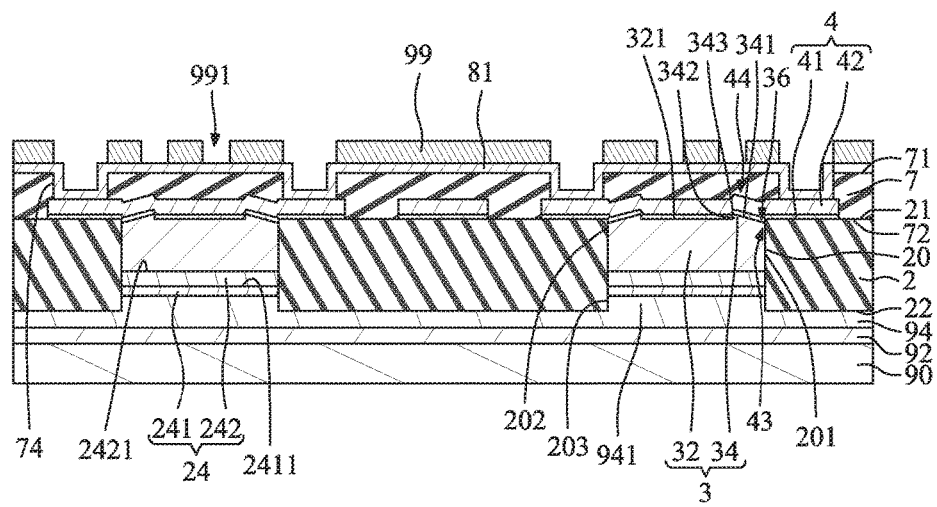
FIG. 27 illustrates one or more stages of an example of a method for manufacturing a semiconductor package structure according to some embodiments of the present disclosure.

Referring to FIG. 27, a fifth metal layer 81 is formed on the second dielectric layer 7 and on the first circuit layer 4 in the openings 74 of the second dielectric layer 7. The fifth metal layer 81 may include, for example, copper. Then, a third photoresist layer 99 is formed on the fifth metal layer 81. The third photoresist layer 99 defines a plurality of openings 991 to expose portions of the fifth metal layer 81.

Figure 28:
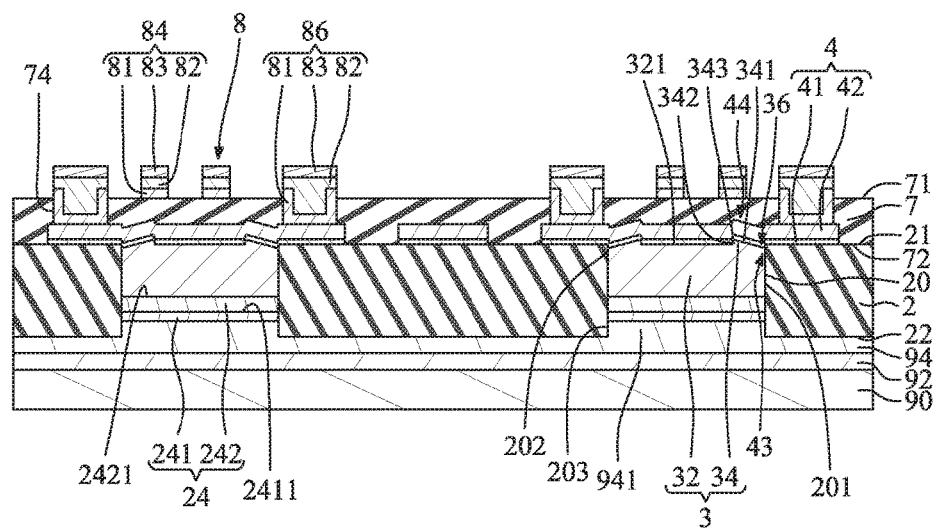
FIG. 28 illustrates one or more stages of an example of a method for manufacturing a semiconductor package structure according to some embodiments of the present disclosure.

Referring to FIG. 28, a sixth metal layer 82 and a seventh metal layer 83 are formed on the fifth metal layer 81 in the openings 991 of the third photoresist layer 99. The sixth metal layer 82 may include, for example, nickel. The seventh metal layer 83 may include, for example, gold. The sixth metal layer 82 and the seventh metal layer 83 may be formed by sputtering and/or plating. Then, the third photoresist layer 99 is removed by, for example, stripping. Then, portions of the fifth metal layer 81 which is not covered by the sixth metal layer 82 and the seventh metal layer 83 are removed by, for example, etching. Accordingly, the second circuit structure 8 is formed. The second circuit structure 8 includes a plurality of conductive traces 84 and a plurality of bump pads 86. As shown in FIG. 28, since the first surface 321 of the first portion 32 of the conductive element 3 is substantially coplanar with the first surface 21 of the first dielectric layer 2, the first surface 71 of the second dielectric layer 7 is a substantially even surface, which results in that at least a portion of the second circuit structure 8 is formed right above the conductive element 3. The portions of the fifth metal layer 81, the sixth metal layer 82 and the seventh metal layer 83 disposed in the opening 74 defined by the second dielectric layer 7 constitute the bump pad 86. The portions of the fifth metal layer 81, the sixth metal layer 82 and the seventh metal layer 83 disposed on the first surface 71 of the second dielectric layer 7 are patterned and constitute the conductive trace 84. The conductive traces 84 may be disposed on the first surface 71 of the second dielectric layer 7 or embedded in the second dielectric layer 7, and are electrically connected to the bump pads 86. In some embodiments, at least one of the conductive traces 84 is disposed right above the conductive element 3. Each of the bump pads 86 is disposed in respective one of the openings 74 defined by the second dielectric layer 7, and may protrude from the first surface 71 of the second dielectric layer 7. In addition, a line width and a line space (L/S) of the second circuit structure 8 may be less than, e.g., about 7 μm and about 7 μm, about 5 μm and about 5 μm, or about 2 μm and about 2 μm, respectively.

Figure 29:
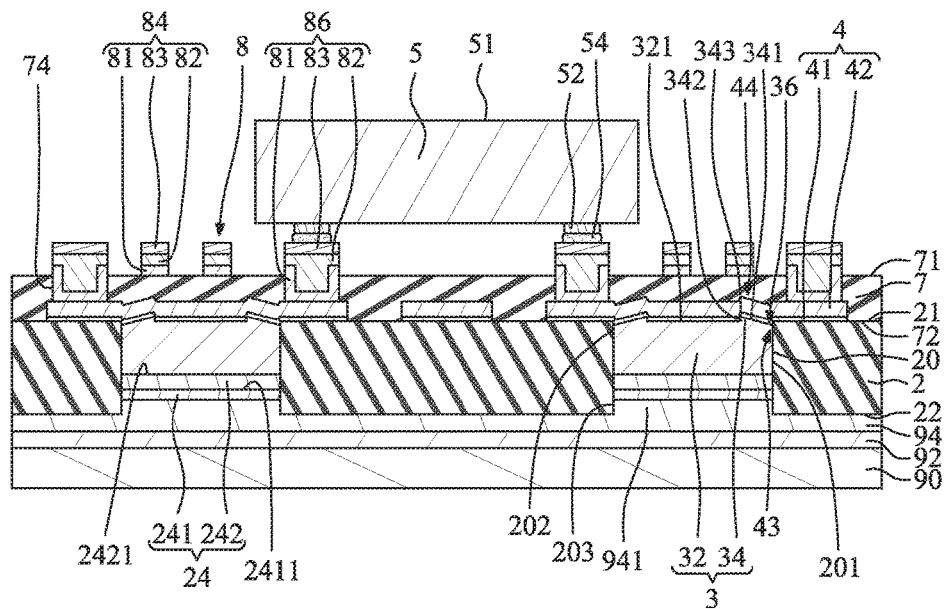
FIG. 29 illustrates one or more stages of an example of a method for manufacturing a semiconductor package structure according to some embodiments of the present disclosure.

Referring to FIG. 29, a semiconductor die 5 is provided. The semiconductor 5 is electrically connected to the first circuit structure 4 by, e.g., flip chip bonding techniques. In some embodiments, the semiconductor die 5 includes a plurality of metal pillars 52 and a plurality of solder connectors 54. The metal pillars 52 are connected to the bump pads 86 of the second circuit structure 8 through the solder connectors 54, such that the semiconductor die 5 can be electrically connected to the first circuit structure 3.

Figure 30:
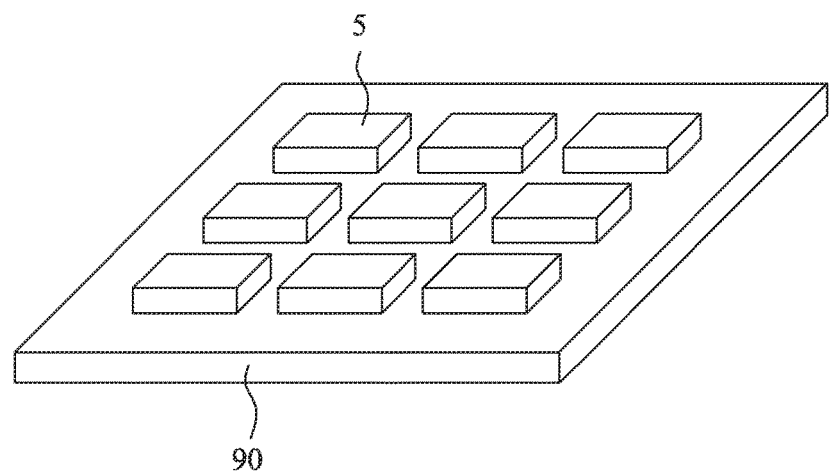
FIG. 30 illustrates one or more stages of an example of a method for manufacturing a semiconductor package structure according to some embodiments of the present disclosure.

FIG. 30 illustrates a schematic perspective view of the carrier 90 and the semiconductor die 5 depicted in FIG. 29 according to some embodiments of the present disclosure. The shape of the carrier 90 may be, e.g., rectangular or square.

Figure 31:
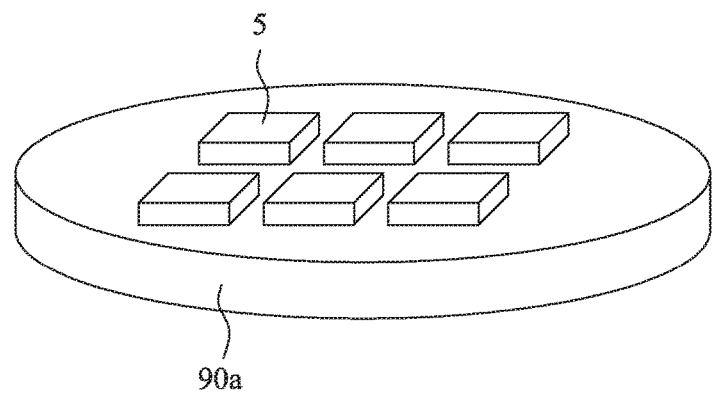
FIG. 31 illustrates one or more stages of an example of a method for manufacturing a semiconductor package structure according to some embodiments of the present disclosure.

FIG. 31 illustrates a schematic perspective view of the carrier 90a and the semiconductor die 5 depicted in FIG. 29 according to some embodiments of the present disclosure. The shape of the carrier 90a may be, e.g., circular or elliptical.

Figure 32:
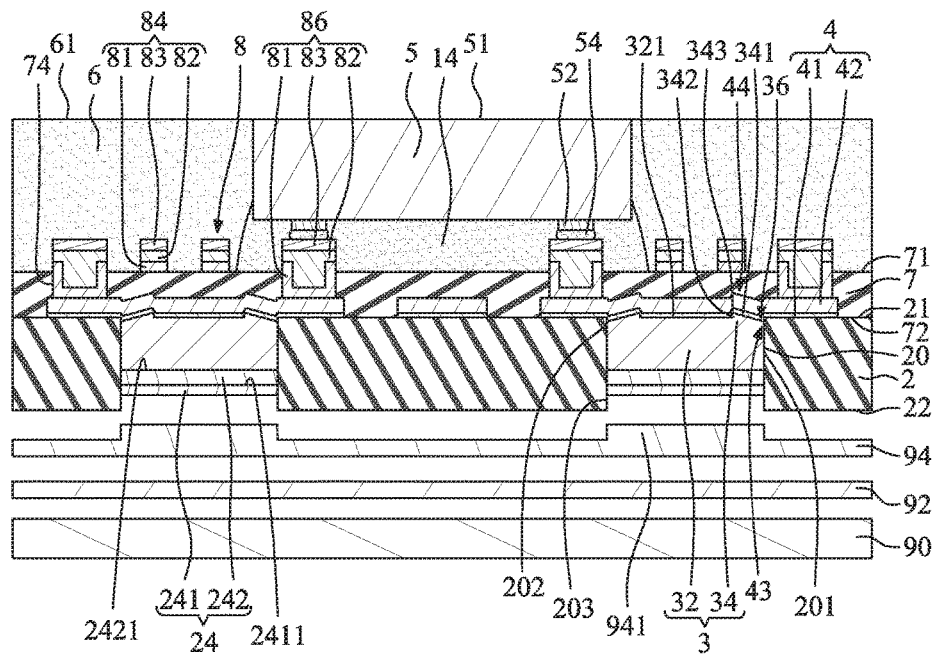
FIG. 32 illustrates one or more stages of an example of a method for manufacturing a semiconductor package structure according to some embodiments of the present disclosure.
Figure 33:
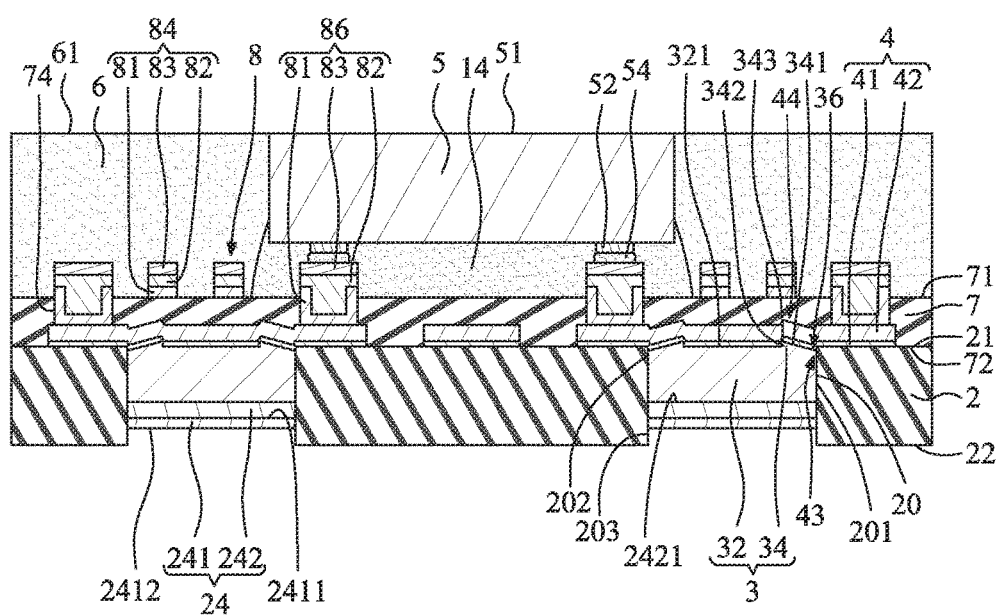
FIG. 33 illustrates one or more stages of an example of a method for manufacturing a semiconductor package structure according to some embodiments of the present disclosure.

Referring to FIG. 32, an underfill 14 is applied to a space between the semiconductor die 5 and the second dielectric layer 7, so as to cover and protect the bump pads 86, the metal pillars 52 and the solder connectors 54. Then, the encapsulant 6, such as including a molding compound, is formed and covers at least one side surface of the semiconductor die 5, the underfill 14 and the first surface 71 of the second dielectric layer 7. A top surface 61 of the encapsulant 6 is substantially coplanar with a top surface 51 of the semiconductor die 5, such that the heat from the semiconductor die 5 can be dissipated. Then, the carrier 90 and the adhesion layer 92 are removed, and the metal layer 94 is exposed. Then, the metal layer 94 and the thin layer 941 are removed by, for example, etching. Thus, the first metal layer 241 of the base layer 24 is exposed, as shown in FIG. 33. Then, a solder ball 26 is formed on the first metal layer 241 in the through hole 20 of the dielectric layer 2. Then, a singulation process is performed, thus forming the semiconductor package structure 1 as shown in FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. A semiconductor package structure, comprising:
a first dielectric layer defining at least one through hole;
a conductive element disposed in the through hole and including a first portion and a second portion, wherein a first surface of the first portion is planar and substantially coplanar with a first surface of the first dielectric layer, and a portion of a first surface of the second portion is recessed from the first surface of the first dielectric layer;
a first circuit structure disposed on the first dielectric layer;
a semiconductor die electrically connected to the first circuit structure; and
an encapsulant covering the semiconductor die.

2. The semiconductor package structure of claim 1, further comprising a second dielectric layer covering the first circuit structure and disposed on at least the second portion of the conductive element.

3. The semiconductor package structure of claim 1, wherein the first portion of the conductive element is located at a center of the through hole.

4. The semiconductor package structure of claim 3, wherein the second portion is away from the center of the through hole and adjacent to a side wall of the through hole, and the second portion includes a recess portion that is defined by the first surface of the second portion and the side wall of the through hole.

5. The semiconductor package structure of claim 1, wherein the conductive element includes a plurality of second portions and a plurality of third portions, a first surface of each of the third portion is substantially coplanar with the first surface of the first portion, and the second portions and the third portions are alternately arranged on a peripheral surface of the first portion.

6. The semiconductor package structure of claim 1, wherein the first portion is away from the center of the through hole, the second portion is located adjacent to a center of the through hole, and the conductive element includes a recess portion that is defined by the first surface of the second portion.

7. The semiconductor package structure of claim 1, wherein an angle θ is formed between the first surface of the second portion and the first surface of the first dielectric layer, and the angle θ is 0 degree to about 15 degrees.

8. The semiconductor package structure of claim 1, wherein the second portion of the conductive element includes a protrusion portion protruding from the first surface of the first dielectric layer.

9. The semiconductor package structure of claim 8, wherein an angle θ is formed between the first surface of the second portion and the first surface of the first dielectric layer, the protrusion portion has a maximal thickness d, a distance D is defined between an inner edge of the protrusion portion adjacent to a center of the through hole and the side wall of the through hole, wherein $$d \le \frac{D}{2} \times \tan\theta,$$

and d is less than about 5 μm.

10. The semiconductor package structure of claim 1, further comprising a second circuit structure above the first circuit structure and electrically connected to the first circuit structure.

11. The semiconductor package structure of claim 10, wherein a portion of the second circuit structure is located right above the conductive element.

12. The semiconductor package structure of claim 1, wherein a portion of the first circuit structure is disposed on the second portion of the conductive element.

13. A semiconductor package structure, comprising:
a first dielectric layer defining at least one through hole;
a conductive element disposed in the through hole and defining at least one recess portion, wherein the conductive element includes a first portion, a plurality of second portions and a plurality of third portions, a first surface of the first portion is substantially coplanar with a first surface of the first dielectric layer, a portion of a first surface of at least one second portion of the plurality of second portions is recessed from the first surface of the first dielectric layer, a first surface of each of the third portions is substantially coplanar with the first surface of the first portion, and the second portions and the third portions are alternately arranged on a peripheral surface of the first portion;
a first circuit structure disposed on the first dielectric layer and the conductive element, wherein the first circuit structure includes a first portion conformal with the recess portion of the conductive element;
a semiconductor die electrically connected to the first circuit structure; and
an encapsulant covering the semiconductor die.

14. The semiconductor package structure of claim 13, wherein the recess portion is defined by a side wall of the through hole and a first surface of the conductive element.

15. The semiconductor package structure of claim 13, wherein the conductive element further includes a protrusion portion protruding from the first surface of the first dielectric layer, an angle θ is formed between the first surface of the at least one second portion of the conductive element in the recess portion and the first surface of the first dielectric layer, and the angle θ is 0 degree to about 15 degrees.

16. The semiconductor package structure of claim 15, wherein the protrusion portion has a maximal thickness d, a distance D is defined between an inner edge of the protrusion portion adjacent to a center of the through hole and the side wall of the through hole, wherein $$d \le \frac{D}{2} \times \tan\theta,$$

and d is less than about 5 μm.

17. The semiconductor package structure of claim 15, wherein the first circuit structure further includes a second portion conformal with the protrusion portion of the conductive element.

18. A method for manufacturing a semiconductor package device, comprising:
(a) providing a first dielectric layer defining at least one through hole;
(b) forming a patterned photoresist layer on the first dielectric layer, wherein a first portion of the patterned photoresist layer is located above the through hole, and the first portion of the patterned photoresist layer is located at a center of the through hole;
(c) forming a conductive element in the through hole, wherein the conductive element contacts the first portion of the patterned photoresist layer; and
(d) forming a first circuit structure on the dielectric layer and on the conductive element.

19. The method of claim 18, wherein in (a), the first dielectric layer is formed on a carrier.

20. The method of claim 19, wherein after (d), the method further comprises:

(e) providing a semiconductor die to electrically connect the first circuit structure; and (f) removing the carrier.

21. The method of claim 18, wherein in (c), a recess portion of the conductive element is defined by a first surface of the conductive element and a side wall of the through hole.

22. The method of claim 21, wherein the conductive element is formed on a first surface in the through hole by plating, and a uniformity of the first surface is less than about 5%.

23. The method of claim 18, wherein in (c), a first portion of the conductive element contacts a lower surface of the first portion of the patterned photoresist layer and a second portion of the conductive element extends to a side surface of the first portion of the patterned photoresist layer to form a protrusion portion.

24. The method of claim 23, wherein an angle θ is formed between a first surface of the second portion of the conductive element and a first surface of the first dielectric layer, the patterned photoresist layer defines an opening communicated with the through hole defined by the dielectric layer, wherein a width D of the opening is defined along a direction from a side wall of the through hole to the center of the through hole, the protrusion portion has a maximal thickness d, wherein $$d \leq \frac{D}{2} \times \tan\theta,$$

and d is less than about 5 μm.

25. The method of claim 18, wherein after (d), the method further comprises:

(e) forming a second circuit structure on the first circuit structure, wherein a portion of the second circuit structure is formed right on the conductive element.

26. A semiconductor package structure, comprising:

a first dielectric layer defining at least one through hole;

a first circuit structure disposed on a first surface of the first dielectric layer and extending to the through hole, wherein the circuit structure includes a trace and a conductive via, and the conductive via includes a protrusion portion protruding from the first surface of the first dielectric layer, and the trace is disposed on the conductive via;

a semiconductor die electrically connected to the circuit structure; and an encapsulant covering the semiconductor die.

27. A semiconductor package structure, comprising:

a first dielectric layer defining at least one through hole;

a conductive element disposed in the through hole and including a first portion and a second portion, wherein a first surface of the first portion is substantially coplanar with a first surface of the first dielectric layer, a portion of a first surface of the second portion is recessed from the first surface of the first dielectric layer, and the second portion of the conductive element includes a protrusion portion protruding from the first surface of the first dielectric layer;

a first circuit structure disposed on the first dielectric layer;

a semiconductor die electrically connected to the first circuit structure; and an encapsulant covering the semiconductor die.

\* \* \* \* \*